(12) United States Patent
Winters et al.

(10) Patent No.: US 7,642,109 B2
(45) Date of Patent: Jan. 5, 2010

(54) ELECTRICAL CONNECTION IN OLED DEVICES

(75) Inventors: Dustin L. Winters, Webster, NY (US);
Kelvin Nguyen, Rochester, NY (US);
Lee W. Tutt, Webster, NY (US); Robert H. Cuffney, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 381 days.

(21) Appl. No.: 11/214,126

(22) Filed: Aug. 29, 2005

(65) Prior Publication Data

US 2007/0048886 A1    Mar. 1, 2007

(51) Int. Cl.
*H01L 21/00* (2006.01)

(52) U.S. Cl. .......................... 438/29; 438/99; 438/795; 257/E51.001; 257/E51.019

(58) Field of Classification Search .................. 438/99, 438/29, 795; 257/E51.019, E51.001
See application file for complete search history.

(56) References Cited

U.S. PATENT DOCUMENTS

| | | | |
|---|---|---|---|
| 5,276,380 A | 1/1994 | Tang | |
| 5,550,066 A | 8/1996 | Tang et al. | |
| 6,281,634 B1 | 8/2001 | Yokoyama | |
| 6,392,340 B2 | 5/2002 | Yoneda et al. | |
| 6,456,013 B1 | 9/2002 | Komiya et al. | |
| 6,501,466 B1 | 12/2002 | Yamagishi et al. | |
| 6,535,185 B2 | 3/2003 | Kim et al. | |
| 6,538,374 B2 | 3/2003 | Hosokawa | |
| 6,552,364 B2 * | 4/2003 | Beck et al. | 257/79 |
| 6,737,800 B1 | 5/2004 | Winters et al. | |
| 6,753,654 B2 | 6/2004 | Koyama | |
| 7,189,991 B2 * | 3/2007 | Yu et al. | 257/40 |
| 2003/0146693 A1 | 8/2003 | Ishihara et al. | |
| 2004/0160170 A1 | 8/2004 | Sato et al. | |
| 2004/0253756 A1 | 12/2004 | Cok et al. | |
| 2005/0012094 A1 * | 1/2005 | Park | 257/40 |

\* cited by examiner

*Primary Examiner*—Matthew C Landau
*Assistant Examiner*—Vicki B Booker
(74) *Attorney, Agent, or Firm*—Raymond L. Owens

(57) ABSTRACT

A method of making an OLED device, including providing a substrate having a first electrode and a conductive bus line provided over the substrate and organic EL media provided over the first electrode and over the conductive bus line; forming a radiation absorbing structure associated with the conductive bus line; exposing the radiation absorbing structure to radiation to produce heat sufficient to ablate a portion of the organic EL media thereby forming an opening in the organic EL media; and forming a second electrode over the organic EL media, and through the opening in the organic EL media thereby forming an electrical connection between the second electrode to the conductive bus line.

13 Claims, 10 Drawing Sheets

ELECTRICAL CONNECTION IN OLED DEVICES

CROSS REFERENCE TO RELATED APPLICATIONS

Reference is made to commonly assigned U.S. patent application Ser. No. 11/071,702 filed Mar. 3, 2005, entitled "Apparatus and Method for Forming Vias" by Cok et al and U.S. patent application Ser. No. 11/071,711 filed Mar. 3, 2005, entitled "Apparatus and Method for Forming Vias" by Cok et al, the disclosures of which are incorporated herein.

FIELD OF INVENTION

This invention relates to forming electrical connection between an electrode and a bus in an OLED device.

BACKGROUND OF THE INVENTION

In the simplest form, an organic electroluminescent (EL) device is comprised of organic electroluminescent media disposed between first and second electrodes. The first and second electrodes serve as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

The simplest pixelated OLED displays are driven in a passive matrix configuration. In a passive matrix, the organic EL material is sandwiched between two sets of electrodes, arranged orthogonally as rows and columns. An example of a passive matrix driven OLED display is described in U.S. Pat. No. 5,276,380. This approach to producing a pixelated display, however, has several disadvantages. First, only a single row (or column) is illuminated at any given time. Therefore, in order to achieve the desired average brightness for a given frame of video, the row should be illuminated to an instantaneous brightness equal to the desired average brightness multiplied by the number of rows. This results in higher voltages and reduced long term reliability compared to a situation where the pixels are capable of being lit continuously for the entire frame. Second, the combination of high instantaneous current and electrodes that are long and narrow, and therefore have high resistance, results in significant voltage drops across the device. These variations in voltage across the display adversely affect brightness uniformity. These two effects become worse as the size of the display and number of rows and columns are increased, thereby limiting the usefulness of passive matrix designs to relatively small, low resolution displays.

To resolve these problems and produce higher performance devices, OLED displays driven by active matrix (AM) circuitry have been shown. In an active matrix configuration, each pixel is driven by multiple circuit elements such transistors, capacitors, and signal lines. This circuitry permits the pixels of multiple rows to remain illuminated simultaneously, thereby decreasing the required peak brightness of each pixel. Examples of active matrix drive OLED displays are shown in U.S. Pat. Nos. 5,550,066, 6,281,634, 6,456,013, 6,501,466, 6,535,185, and 6,753,654.

In order for the light emission to exit the organic electroluminescent device, at least one of the electrodes disposed on either side of the organic electroluminescent medium, such as the anode or cathode, is made to be at least partially transparent. OLED devices are formed on a substrate, such as glass. In one configuration, known as a bottom emitting configuration, the substrate and the electrode between the organic electroluminescent media and substrate, referred to as the lower electrode, are made to be transparent or semi-transparent. In this bottom emitting configuration, the viewer views the display from the side of the substrate. The lower electrode may be constructed, for example, of a conductive film of indium tin oxide (ITO). The other electrode disposed on the opposite side of the organic electroluminescent media, which is referred to as the upper electrode, is typically made to be reflective and highly conductive. Aluminum, Silver, and Magnesium Silver alloys are examples of materials that are useful for this upper electrode.

However, active matrix type OLED displays which are made in a bottom emitting configuration have a problem that the active matrix circuitry, which is typically formed on the substrate prior to the organic electroluminescent media, is not highly transparent to light. Therefore, a portion of the pixel that contains the active matrix circuit components does not emit light. The amount of area that emits light for each pixel relative to the total area of the pixel is known as the aperture ratio (AR). Consequently, the aperture ratio of active matrix type OLED displays which are made in a bottom emitting configuration is relatively low. OLED displays having low apertures ratios must increase the electric current density per unit area through the organic electroluminescent media to achieve the same brightness level as an OLED display having a higher aperture ratio. Driving OLED displays at increase current densities is known to reduce the life time of the device by accelerating luminance efficiency decay over operating time. Also, at increased current densities require the OLED to be driven at increased voltage levels which results in higher power consumption.

To solve these problems, active matrix type OLED displays made in a top emitting configuration have been shown. In a top emitting configuration, light emission generated by the organic electroluminescent media exits the device in the opposite direction of the substrate. Therefore, the active matrix circuitry is not in the path of the light emission and aperture ratio can be increased. Examples of top emitting active matrix OLED displays are shown in U.S. Pat. Nos. 6,737,800 and 6,392,340.

In a top emitting configuration, the upper electrode is made to be transparent or semi-transparent. For example, transparent upper electrodes can be constructed of Indium Tin Oxide (ITO) or similar transparent conductive oxide materials. Also metal films such as aluminum or silver can be used to create a semi-transparent upper electrode if the thickness of the metal is thin, such as, for example, less than 30 nm. However, these transparent and semi-transparent upper electrodes have the problem that they are not highly conductive. That is, since these films are made to be thin or of a material with low conductivity such as ITO, the sheet resistance of the upper electrode is high. High sheet resistance of the upper electrode can result in voltage drops across the upper electrode and across the display, which can result in variations in the luminance output of the pixels. Also, high sheet resistance can result in increased power consumption as well as heat generation.

One approach to improving the conductivity of the upper electrode for a top emitting active matrix type OLED display as proposed in U.S. Pat. No. 6,538,374 is to dispose patterned lines of highly conductive materials, such as aluminum, in electrical contact with the upper electrode in a region between the pixels. However, this approach has the disadvantage that patterning of the lines of conductive material after forming the organic electroluminescent material is difficult to achieve. This is because conventional photolithography with solvent based resist materials often cannot typically be applied without damaging the organic electroluminescent materials. Other methods, such as formation of the lines of conductive material by deposition through a shadow mask are difficult to align, particularly if applied to large substrates.

Another approach to improving the conductivity of the upper electrode for a top emitting active matrix type OLED display is to connect the upper electrode to highly conductive current supply lines provided on the substrate prior to deposition of the organic electroluminescent materials. Such current supply lines can be formed by photolithography methods. Examples of OLED displays where the upper electrode is connected to current supply line located on the substrate are shown in U.S. Patent Application Publications 2003/0146693 A1 and 2004/0160170 A1. In this approach, a region between the pixels is provided with a connection area that is free of the organic electroluminescent materials in order for the upper electrode to make electrical connection to the current supply lines on the substrate. This can be achieved by selectively depositing the organic electroluminescent materials by, for example, use of precision aligned shadow masks. However, such precise patterning and alignment during the deposition by, for example precision aligned shadow masks, is difficult to achieve with the needed accuracy on large substrates or for displays having high resolutions.

Alternately, the organic electroluminescent material can be initially deposited over the pixel emission region and the supply line region without precision deposition alignment and then removed in a region between the pixels by a means such as laser ablation prior to formation of the upper electrode as described in U.S. Patent Application Publication 2004/0253756 A1. However, the organic electroluminescent materials are not typically made to be absorbing of wavelengths commonly used for many lasers, particularly visible and infrared wavelengths. In fact, the organic electroluminescent materials are typically highly transparent at these wavelengths in order to facilitate emission of visible light. This limits the choice of lasers to those having specific ranges of wavelengths such as ultraviolet or near ultraviolet wavelengths or lasers having high power density output, thereby resulting in high manufacturing cost.

SUMMARY OF THE INVENTION

It is an object of the present invention to provide an OLED device having reduced resistance to current flowing in the upper electrode. It is a further object of the present invention to provide an OLED display that can be more easily fabricated given the above problems.

These objects are achieved by a method for making an OLED device, comprising:

a) providing a substrate having a first electrode and a conductive bus line provided over the substrate and organic EL media provided over the first electrode and over the conductive bus line;

b) forming a radiation absorbing structure associated with the conductive bus line;

c) exposing the radiation absorbing structure to radiation to produce heat sufficient to ablate a portion of the organic EL media thereby forming an opening in the organic EL media; and d) forming a second electrode over the organic EL media, and through the opening in the organic EL media thereby forming an electrical connection between the second electrode to the conductive bus line.

BRIEF DESCRIPTION OF THE DRAWINGS

FIG. 3 depicts a cross sectional view along line X-X' of the OLED display device of FIG. 2a;

Since feature dimensions such as layer thicknesses are frequently in sub-micrometer ranges, the drawings are scaled for ease of visualization rather than dimensional accuracy.

DETAILED DESCRIPTION OF THE INVENTION

Figure 1:
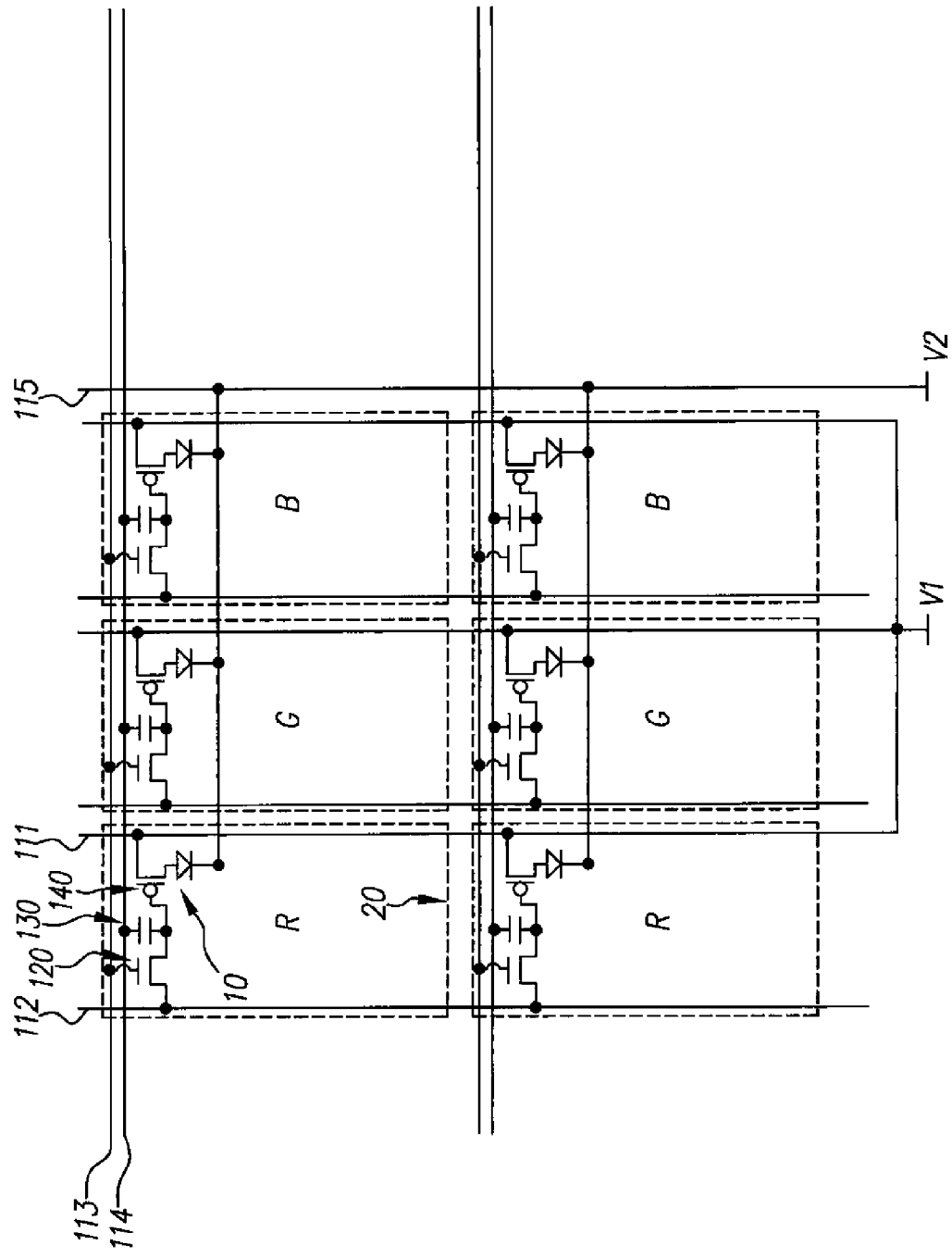
FIG. 1 depicts a circuit layout of the active matrix drive circuitry of an OLED display device according to the present invention.

FIG. 1 shows a circuit schematic diagram for the active matrix drive circuitry of an active matrix type OLED display according to the present invention. While, two rows and three columns of pixels are shown, this basic design can be expanded to a larger number of rows and columns by one skilled in the art. The display includes multiple pixels such as pixel 20. The pixels are red (R), green (G), and blue (B) forming an RGB display. However, the present invention is not limited to this case and can also be applied to monochrome displays as well as multi-color displays having greater or fewer numbers of differently colored pixels. For example, the present invention can also be applied to displays having red, green, blue and white (RGBW).

The active matrix drive circuitry is composed of signal lines such as select line 113, capacitor line 114, data line 112, power line 111, and conductive bus line 115. These signal lines are common to either a row or a column of pixels as shown and are arranged to drive the pixels of the row or column.

The active matrix drive circuitry further includes circuit components for each pixel such as select transistor 120, power transistor 140, and storage capacitor 130 for pixel 20, which together with one of more of the signal lines are arranged to drive the organic light-emitting diode 10 of pixel 20. The other pixels are provided with similar components to drive the respective organic light-emitting diodes of these other pixels. The anode of organic light-emitting diode 10 is electrically connected to power transistor 140 as shown. The term "electrical connection" is used in this disclosure to indicate connection either directly by way of a conductor or indirectly through a component such as a switch, transistor, diode or the like. The cathode of organic light-emitting diode 10 is electrically connected to conductive bus line 115 as shown. Conductive bus line 115 provides a low resistance way of carrying the cathode current. Electrical power is supplied to the organic light-emitting diodes by way of a first voltage source (V1) electrically connected to the power lines and a second voltage source (V2) electrically connected to the bus lines. Alternately, the organic light-emitting diodes can be arranged in the opposite orientation with the cathodes connected to the power transistors and the anodes connected to the bus lines. One bus line is provided for every three columns of pixels. Alternately, bus lines can be provided at other intervals such as every column, every second column, or larger intervals. Bus lines can alternately be provided in the direction of the rows instead of the direction of the columns.

The operation of this circuit will now be described. Each row of pixels is selected in turn by applying a voltage signal to the select line associated with the row, such as select line 113, which turns on the select transistor, such as select transistor 120, for each pixel. The brightness level, or gray scale information, for each pixel is controlled by a voltage signal, which has been set on the data lines, such as data line 112. The storage capacitor, such as storage capacitor 130, for each pixel is then charged to the voltage level of the data line associated with that pixel and maintains the data voltage until the row is selected again during the next image frame. The storage capacitor 130 is connected to the gate terminal of the power transistor 140. Power transistor 140 regulates the current flow through its source and drain terminals and to the organic light-emitting diode 10 in response to the voltage level held on it gate terminal by storage capacitor 130, thereby controlling the pixel's brightness. Each row is then unselected by applying a voltage signal to the select line, which turns off the select transistors. The data line signal values are then set to the levels desired for the next row and the select line of the next row is turned on. This is repeated for every row of pixels.

As such, select lines are signal lines that serve the function of isolating a row of pixels so that the gray scale information can be loaded into the pixels of the row. Data lines are signal lines that provide the gray scale information to the pixels. This gray scale information can be in the form of a voltage or current signal. Power lines are signal lines that provide a source of electrical power to the organic light-emitting diodes of the pixels for maintaining the brightness level of the pixel, at least during the time when the pixels row is not selected by the select line. Typically, the power lines provide a source of electrical power to the organic light-emitting diode at all times when the pixels are illuminated. The bus lines are electrically connected to either the cathode or the anode of the organic light emitting diode and provide a low resistance path to complete the circuit for the current provided from the power line and through the organic light emitting diode.

Many different alternate types of circuit arrangements are known in the art for driving OLED displays. These alternate types of circuits arrangements have various arrangements and numbers of circuit components and signal lines serving these basic functions. By adding bus lines and forming openings in the organic EL media using the methods described herein, the present invention can be applied to these alternate types of circuit arrangements by one skilled in the art. As such, the present invention is not limited to the specific circuit arrangement shown here. These alternate circuit arrangements include, for example, current mirror type circuits similar to those shown in U.S. Pat. Nos. 6,091,203, 6,501,466, 6,535,185 and 6,774,877 as well as the pixel circuits shown in U.S. Pat. No. 6,229,506 and the pixel circuit described in U.S. Patent Application Publication 2004/0222746 A1.

In this example, the organic light emitting diodes of the differently colored pixels are electrically connected together at their cathode terminals. That is, the pixels share a common cathode. Therefore the bus lines, such as conductive bus line 115, for the differently colored pixels are maintained at approximately the same voltage level for the differently colored pixels. Alternately, if the device where arranged in the opposite orientation with the anodes of the organic light emitting diodes connected to the bus lines as described above, a common anode connection could be used. The present invention, however, is not limited to these cases, and other embodiments where the organic light emitting diodes of the differently colored pixels are not electrically connected together and where the bus lines of these differently colored pixels are able to be maintained at different voltage levels can also be practiced by one skilled in the art.

Figure 2A:
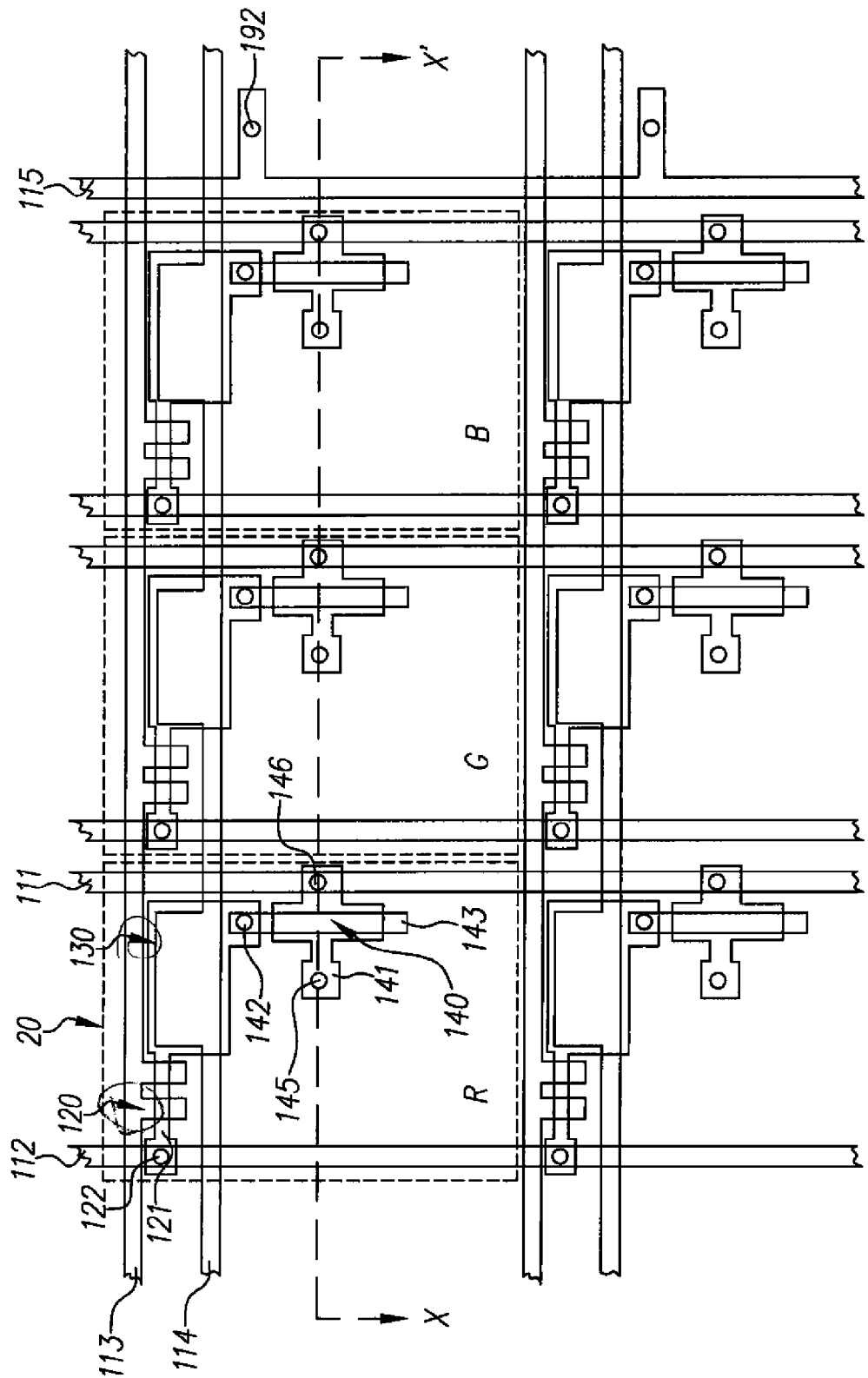
FIGS. 2a-2b depicts the construction and layout of the components of the drive circuitry used to drive pixels of an OLED display device according the first embodiment of present invention.
Figure 2B:
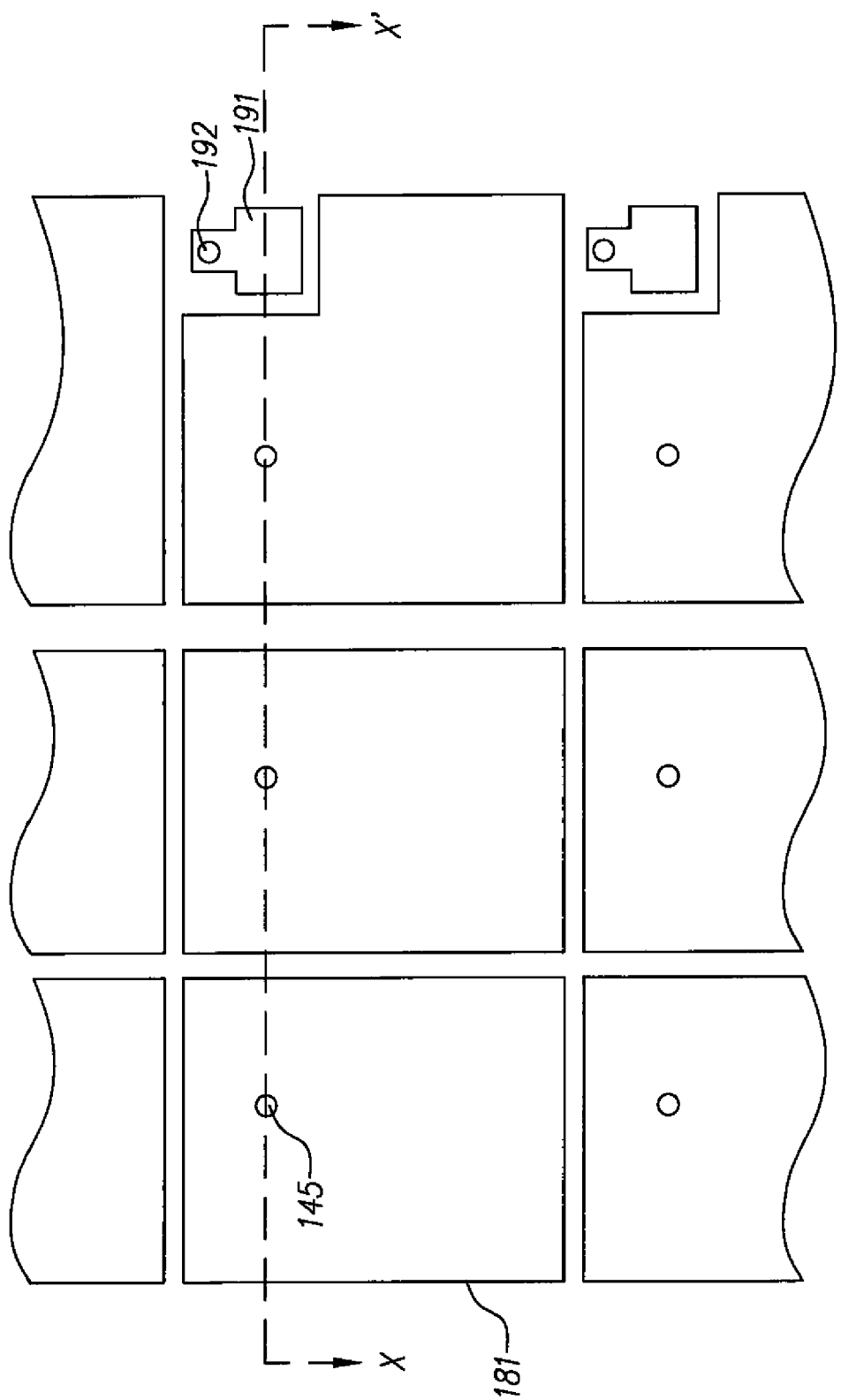

A layout diagram for the portions of the drive circuitry used to drive the pixels such as pixel 20 according to the first embodiment of the present invention is shown in FIG. 2*a* and FIG. 2*b*. The drive circuitry components are patterned from layers formed over the substrate. In this example, these layers include, in order from the closest to the substrate to the furthest from the substrate, a semiconductor layer, a first conductive layer, a second conductive layer, and a third conductive layer. The semiconductor layer is used to form elements such as first semiconductor region 121 and second semiconductor region 141. The first conductive layer is used to form elements such as select line 113, capacitor line 114 and power transistor gate 143. The second conductive layer is used to form elements such as data line 112 and power line 111. The third conductive layer is used to form elements such as lower electrode 181 and radiation absorbing structure 191. Insulating (or dielectric) layers are formed between these layers to prevent electrical contact between the layers except where openings (or vias) are formed in the dielectric material.

The present invention, however, is not limited to this layer arrangement and other arrangements having more or less layers and layers in alternate orders can be successfully practiced by one skilled in the art. For example, this arrangements uses top gate thin film transistors where the semiconductor is between the substrate and the gates formed in the first conductive layer. The invention can also be made to work with bottom gate thin film transistors where the gates formed in the first conductive layer are instead between the substrate and the semiconductor layer.

FIG. 2*a* shows the elements formed from the first several layers disposed above the substrate, including for example, the semiconductor layer, the first conductive and the second conductive layer as well as the vias for connections between these layers. FIG. 2*b* shows elements formed from the third conductive layer such as the lower electrodes and radiation absorbing structures, which are disposed above the elements shown in FIG. 2*a*. The vias, such as via 145 and via 192, connecting the elements of the third conductive layer, such as lower electrode 181 and radiation absorbing structure 191, to the elements of the lower layers are shown in both FIG. 2*a* and FIG. 2*b*.

The construction and layout of the various circuit components such as select transistor 120, storage capacitor 130, and power transistor 140 are shown. The drive circuitry components are fabricated using known integrated circuit and thin film transistor fabrication technologies. Select transistor 120 is formed from a first semiconductor region 121 in the semiconductor layer using techniques well known in the art. Select transistor 120 is shown as a double gate type transistor, however, this is not required for successful practice of the present invention and a single gate type transistor can also be used. Similarly, power transistor 140 is formed in a second semiconductor region 141 in the semiconductor layer. The first semiconductor region 121 and second semiconductor region 141 are preferably formed from the same semiconductor layer. This semiconductor layer is preferably silicon such as polycrystalline or crystalline silicon, but can also be amorphous silicon or silicon having other states of crystal structures. Other inorganic and organic semiconducting materials known in the art can also be used. This first semiconductor region 121 also forms one side of storage capacitor 130. Over the first semiconductor region 121 and second semiconductor region 141, is an insulating layer (not shown) of a material such as silicon nitride that forms the gate insulator of select transistor 120, the gate insulator for power transistor 140, and the insulating layer of storage capacitor 130. The gate of select transistor 120 is formed from part of select line 113, which is formed in the first conductor layer. Power transistor 140 has a separate power transistor gate 143 also preferably formed in the first conductor layer. The other electrode of storage capacitor 130 is formed as part of capacitor line 114, are also preferably formed from the first conductive layer. Useful materials for the first conductive layer include, for example, Al, Cr, and Mo or alloys containing at least one of these materials. Power line 111 and data line 112 are preferably formed from a second conductive layer. Useful materials for the second conductive layer include highly conductive metals such as Al or alloys of Al such as Al:Si or Al:Nd. One or more of the signal lines, for example select line 113, frequently cross at least one or more of the other signal lines, such as for example data line 112. As such, these signal lines are preferably fabricated from multiple conductive layers with at least one interlayer insulating layer (not shown) of a material such as silicon nitride disposed in between the different conductive layers.

The lower electrode 181 of the organic light-emitting diode is connected to power transistor 140. Lower electrode 181 may be, for example, the anode of the organic light emitting diode as previously described. An insulating layer (not shown) of a material such as silicon nitride is located between the lower electrode 181 and the second conductive layer.

Connections between layers are formed by etching holes (or vias) in the insulating layers such as via 122 connecting data line 112 to the first semiconductor region 121. Similarly, via 142 connects the power transistor gate 143 to first semiconductor region 121, via 146 connects the second semiconductor region 141 to power line 111, and the via 145 connects the second semiconductor region 141 to the lower electrode 181.

Lower electrode 181 serves to provide electrical contact to the organic electroluminescent media of the organic light-emitting diodes. Over the perimeter edges lower electrode data, an interpixel insulator layer (not shown) can be formed to cover the edges of the electrodes and reduce shorting defects as described below. Use of similar interpixel insulator layers are also described in U.S. Pat. No. 6,246,179. An opening (not shown) is made in the interpixel insulator layer over the lower electrode 181 to permit the lower electrode 181 to make electrical contact with the organic electroluminescent media of the organic light-emitting diode. The emitting area of pixel 20 is defined by the areas of the lower electrode 181 that is in electrical contact with the organic electroluminescent media. As such, the emitting area is the area of the lower electrode 181 reduced by any area covered by dielectric material. Therefore, when an interpixel is used as described, the emitting area is the area of the opening, in the interpixel insulator layer. While use of such an interpixel insulator layer is preferred, it is not required for successful practice of the present invention.

According to the present invention, the OLED device includes a conductive bus line 115. Conductive bus line 115 provides a low resistance path for carrying the current from the upper electrode since the upper electrode has relatively high lateral resistance. As shown in FIG. 2a and FIG. 2b, conductive bus line 115 is formed from the second conductive layer, which is the same conductive layer that formed the power lines and data lines. However, the present invention is not limited to this case and in alternate embodiments of the present invention, the bus line can be constructed in other conductive layers such as the first or third conductive layer or in yet another conductive layer, such as a conductive layer provided specifically for the purpose of forming the bus line. However, it is preferable that the bus line is constructed in the same conductive layer as the power lines (as shown), the select lines, or the lower electrodes so as to not add additional steps in the manufacturing process. Conductive Bus Line 115 is preferably constructed of a material that is highly conductive such as aluminum or alloys of aluminum.

According to this first embodiment of the present invention, the OLED display further includes radiation absorbing structure 191, which is associated with conductive bus line 115. Radiation absorbing structure 191 serves to form an opening in the organic EL media upon exposure to radiation as will be described in more detail later. By forming an opening in the organic EL media, electrical connection can be made between the upper electrode and the bus line. Each bus line has at least one associated radiation absorbing structure, which serves to form an opening allowing the upper electrode to be electrically connected to its associated bus line. Each bus line may have a plurality of associated radiation absorbing structures spaced with some special frequency. As shown in FIG. 2a and FIG. 2b, one radiation absorbing structure is provided for each row in the column direction. Also, one bus line and one radiation absorbing structure is provided for every third pixel in the row direction. However, the present invention is not limited to this case, and bus lines and radiation absorbing structures can be provided at greater or lesser frequencies.

When radiation absorbing structure 191 is exposed to the radiation during the production process at sufficient intensity to cause ablation of the organic EL media, an opening is formed in the organic EL media. Subsequently, the upper electrode (not shown) is formed above the organic EL media and in the location of the opening in the organic EL media such that the upper electrode makes electrical connection to the radiation absorbing structure 191. Since radiation absorbing structure 191 is also electrically connected to the conductive bus line 115 through via 192, the upper electrode is thereby electrically connected to the conductive bus line 115.

Figure 3:
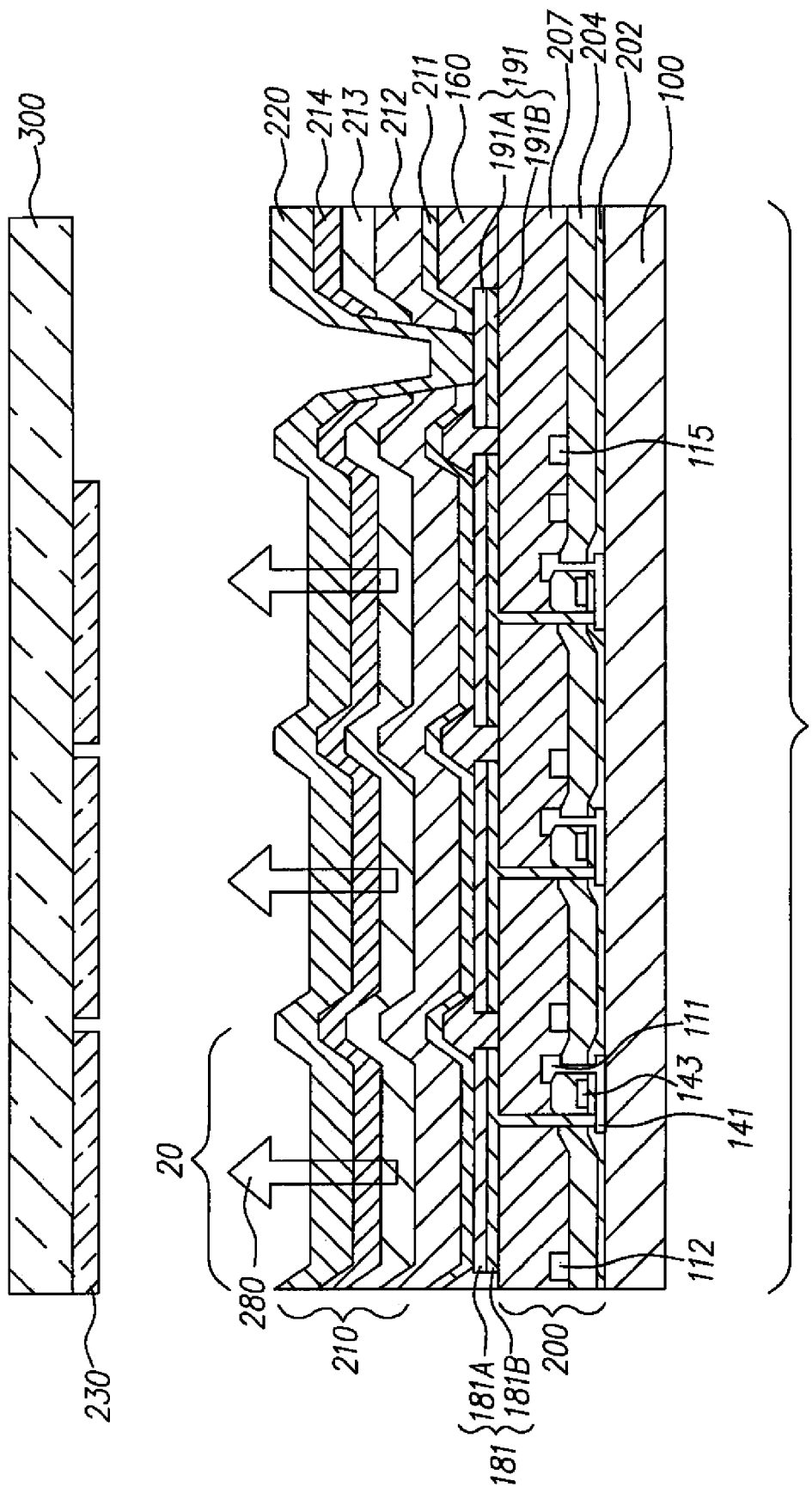

A cross-sectional view illustrating the vertical arrangement of the various layers of the OLED display device of FIG. 2a and FIG. 2b along line X-X' is shown in FIG. 3. From FIG. 3, it can be seen that the pixels, such as pixel 20, are formed above substrate 100. When electrically stimulated, these pixels produce light emission, such as light emission 280. Active matrix circuitry layers 200, including insulating layer 202, insulating layer 204, and insulating layer 207 are shown. The formation of the interpixel insulator layer 160 over the edges of the lower electrodes, such as lower electrode 181, can also be seen.

The multi-layer construction of radiation absorbing structure 191 and lower electrode 181 is shown. Radiation absorbing structure 191 is constructed, at least in part, of a material that absorbs the radiation energy to produce thermal energy thereby resulting in localized ablation of the organic electroluminescent media (not shown). Radiation absorbing structure 191 may be constructed of one or more sub-layers of material. For example, radiation absorbing structure 191 can be constructed of a first sub-layer for absorbing radiation and second sub-layer which serves another function. In this embodiment where radiation absorbing structure is constructed in the third conductor layer along with lower electrode 181, both radiation absorbing structure 191 and lower electrode 181 are constructed of a lower sub-layer which is absorbing to radiation and an upper sub-layer which is reflective to the visible light generated by the organic electroluminescent media. Therefore, lower electrodes 181 and absorbing structure 191 can be formed and patterned in the same manufacturing steps, thereby simplifying the manufacturing process. As such, in preferred embodiments as shown in FIG. 3, absorbing structure 191 includes two portions; lower portion 191b and upper portion 191a. Lower portion 191b serves to absorb the radiation energy. Similarly, lower electrode 181 includes two portions; lower portion 181b and upper portion 181a. Upper portion 181a serves to reflect the visible light generated by the organic electroluminescent media. That is, upper portion 181a of the lower electrode 181 and upper portion 191a of the radiation absorbing structure 191 are both formed of the same upper sub-layer of the third conductive layer. Likewise, lower portion 181b of the lower electrode 181 and lower portion 191b of the radiation absorbing structure 191 are both formed of the same lower sub-layer of the third conductive layer. In this case, during the production process, the radiation would be directed only on lower portion 191b of the radiation absorbing structure 191 and would not be exposed to lower portion 181b of the lower electrode 181 so that an opening in the organic electroluminescent media is created only in the desired location above the radiation absorbing structure 191. The radiation absorbing structure 191, is preferably highly conductive and electrically connected to conductive bus line 115. This electrical connection is provided by via 192. Preferred materials for the upper sub-layer, which forms upper portion 191a and upper portion 181a, include aluminum, aluminum alloys composed of about 98 atomic percent aluminum such as AlNd and the like, silver, and alloys composed of about 98 atomic percent of silver such as AgPdCu and the like. Upper portion 181a is preferably highly reflective to visible light as described. Therefore, the upper sub-layer is preferably constructed to a thickness which is highly reflective and not transparent, for example greater than 50 nm and more preferably greater than 100 nm. Upper portion 191a must also conduct the heat generated when the lower portion 191b is exposed to the radiation. Therefore the upper sub-layer is preferably constructed to a thickness of less than 500 nm and more preferably less than 200 nm in order to minimize lateral diffusion of the heat energy. A preferred radiation type is electromagnetic radiation having a wavelength of between 700 and 1100 nm and more preferably between 800 and 850 nm. Preferred sources of radiation include diode lasers and Nd-YAG lasers. Most preferably, the radiation is generated by diode lasers having a peak emission between 800 and 850 nm. Preferred materials for the lower sub-layer, which forms lower portion 191b and upper portion 181b, absorb electromagnetic radiation at these wavelengths and include Cr and Mo formed at a thickness of between 25 and 100 nm. Cr and Mo absorb incident radiation of these wavelengths at approximately 35% and 45% respectively.

Each of the pixels further includes a portion of organic EL media 210. There are numerous configurations of the organic EL media 210 layers wherein the present invention can be successfully practiced. For the organic EL media, a broadband or white light source that emits light at the wavelengths used by all the pixels is preferred to avoid the need for patterning the organic EL media between pixels. In this case, color filters elements, such as color filter element 230, are provided in the path of the light to produce the desired light colors from the white or broadband emission for a multi-color display. The color filter elements, such as color filter element 230, may be provided on the transparent cover 300, as shown, or alternately over the upper electrode. Some examples of organic EL media layers that emit broadband or white light are described, for example, in U.S. Pat. No. 6,696,177. However, the present invention is not limited to white or broadband emitting organic EL media, and can also be made to work where each differently colored pixel has one or more of the organic EL media layers separately patterned for each pixel to emit differing colors for specific pixels. The organic EL media 210 is constructed of several layers such as; a hole injecting layer 211, a hole transporting layer 212 that is disposed over the hole injecting layer 211, a light-emitting layer 213 disposed over the hole transporting layer 212, and an electron transporting layer 214 disposed over the light-emitting layer 213. Alternate constructions of the organic EL media 210 having fewer or more layers can also be used to successfully practice the present invention. Organic EL media layers applied in the opposite order are also known in the art and can be applied to the present invention. These organic EL media layers include organic materials that are either small molecule materials or polymer materials as is known in the art. These organic EL media layers can be deposited by one or more of several methods known in the art such as, for example, thermal evaporation in a vacuum chamber, laser transfer from a donor substrate, or deposition from a solvent by spin coating or use of an ink jet print apparatus. In the preferred embodiment where the organic EL media is arranged to emit white or broadband light, color filter elements, such as color filter element 230, are disposed in the path of the light produced in the emitting areas of the pixels, such as light emission 280 from pixel 20, so as to filter the color of the light prior to reaching the observer. These color filters may be formed, for example on a transparent cover 300, which is aligned and attached to substrate 100. Alternately, these color filters may be formed, for example, over the upper electrode.

Above the organic EL media 210, an upper electrode 220 is formed. For a configuration where the light is viewed through the substrate, as shown, this upper electrode is preferably highly reflective and can be composed of a metal such as aluminum or silver or a magnesium-silver alloy. However, in an alternate embodiment where the light is viewed in the opposite direction, this electrode should be highly transparent and constructed of thin metals, such as silver with a thickness less than 25 nm, or transparent conductive oxides such as indium tin oxide, or combinations thereof. The upper electrode 220 can also include an electron injecting layer (not shown) composed of a material such as lithium to aid in the injection of electrons. When a region of organic EL media 210 is stimulated by an electrical current between a lower electrode, such as lower electrode 181, and upper electrode 220, the region of organic EL media 210 produces light emission.

Most OLED display devices are sensitive to moisture or oxygen, or both, so they are commonly sealed with an encapsulating means (not shown) in an inert atmosphere such as nitrogen or argon using metal or glass covers, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation and can be applied to the present invention by one skilled in the art. Some examples of barrier layers useful for encapsulating an OLED display device are described in U.S. Patent Application Publications 2001/0052752 A1 and 2002/0003403.

The examples described above for FIG. 1, FIG. 2a, and FIG. 2b show the pixels arranged in a stripe pattern. A stripe pattern has the pixels of the same color aligned in the same column or row. However, the present invention is not limited to this case and alternate patterns where different colored pixels are arranged in the same columns or same rows can also be applied to the present invention. One pixel arrangement pattern that is particularly useful is a quad pattern where the four differently colored pixels are arranged in a rectangular fashion involving two rows and two columns. Quad patterns are advantageous in that the all four differently colored pixels are close to each other, thereby reducing the perception of band defects when one or more of the pixels are not illuminated in an image or portion of an image.

Figure 4:
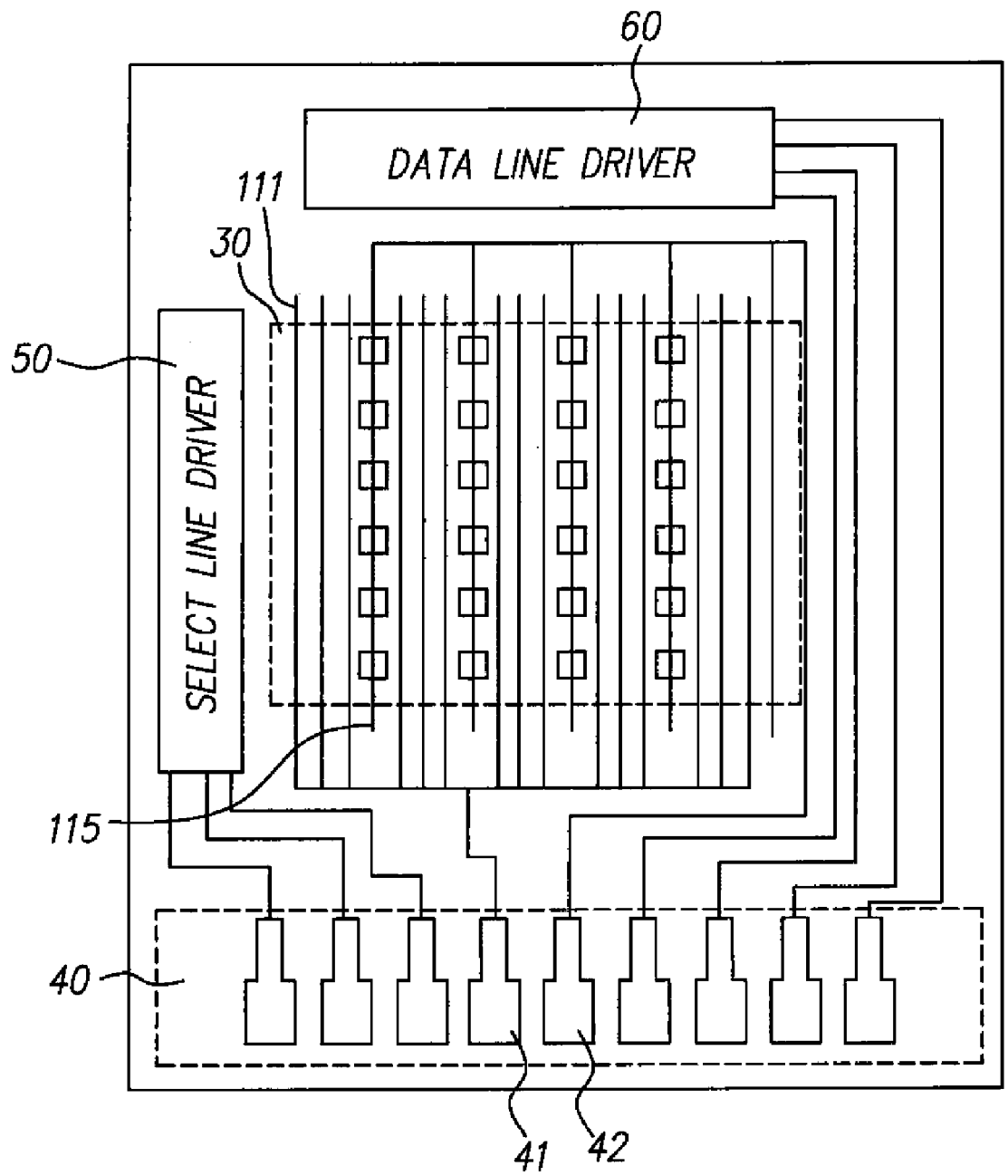
FIG. 4 depicts the layout and wiring of a display according to the present invention.

FIG. 4 shows a conceptual view of a display illustrating the layout and connections of the various parts and sections of a display according one embodiment of the present invention. The display includes a pixel region 30, a connector region 40, a select line driver 50, and a data line driver 60. The select line driver 50 functions to selectively activate the select lines (not shown) for each row as previously described. The data line driver 60 serves to provide data signals to the data lines (not shown) for each column as previously described. The pixel region 30 includes the light-emitting pixels of the display. The regions outside of the pixel region 30 are non-light-emitting regions. The connector region 40 provides a plurality connector pads such a connector pad 41 and connector pad 42. These connector pads serve as a location for bonding of wires or cables that electrically connect the display to external power sources (not shown) or controlling circuits (not shown). For example, connector pad 41 serves as a connection for voltage source V1 and connector pad 42 serves as a connection for voltage source V2. It is preferable that the connector pads are all formed along one edge of the display to reduce the size for the non-light-emitting regions of the display as well as simplify the connection process. While, each of the voltages sources can be electrically connected to a single connector pad, multiple connector pads can also be used to provide a low resistance electrical connection to one or more of the voltage sources as described in U.S. Pat. No. 6,531,815.

Connector pad 41 is electrically connected to the power lines of the gamut-pixels such as power line 111. This electrical connection is formed on one side of the display out side of the pixel region 30. This can be, for example, the same side of the display as the connector region 40, between the pixel region 30 and the connector region 40, as shown. Connector pad 42 is electrically connected to the bus lines such as conductive bus line 115. This electrical connection is also formed on one side of the display out side of the pixel region 30. This can be, for example, the same side of the display as the data line driver 60, between the pixel region 30 and the data line driver 60, as shown. By forming these electrical connections on opposite sides of the display, as shown, the connections to both the power lines and bus lines can be made without the need to cross any of these electrical lines. This facilitates forming the power lines and bus lines in the same conductive layer.

Figure 5A:
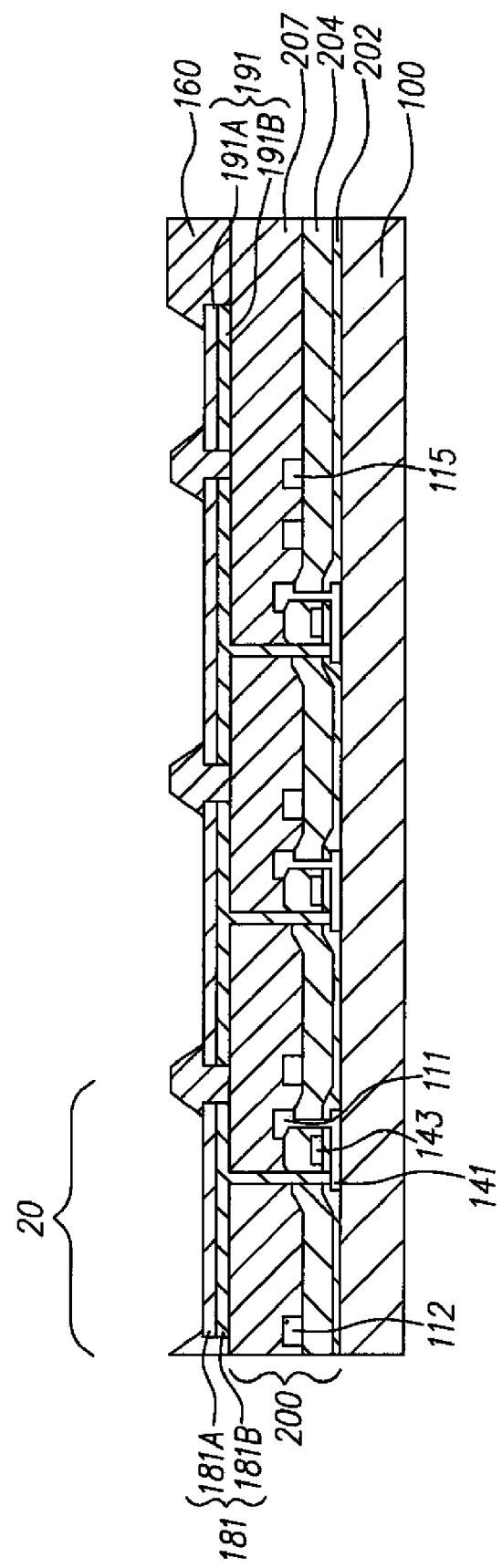
FIGS. 5a-5d depict sequential cross sectional views of an OLED display device at different stages of the fabrication process according to the first embodiment of the present invention.

FIG. 5a through FIG. 5d show sectional cross section views of an OLED display device according to the first embodiment of the present invention in order to better illustrate the fabrication process. To begin, as shown in FIG. 5a, a substrate 100. Active matrix circuitry layers 200 are formed over substrate 100 using methods well known in the art. The lower electrode 181 is formed over the substrate 100 using deposition and patterning processes including photolithography and wet or dry etching techniques known in the art. Radiation absorbing structure 191 is also formed over substrate 100 using the similar deposition and patterning processes including photolithography and wet or dry etching techniques. As previously described, it preferred that lower electrode 181 and radiation absorbing structure 191 be formed from the same layer at the same time. That is, lower electrode 181 and radiation absorbing structure 191 are preferably formed of the same materials. The term forming here refers to the process of patterning and etching the layer to change the blanket films as deposited into the various structures. Forming may also be used to mean deposition of the materials though a shadow mask, in this case preferably the same shadow mask. The initial films from which the films are formed may be composed of multiple sub-layers of differing materials that are deposited sequentially. This preferred configuration avoids the need for addition additional manufacturing steps to provide these two structures. An interpixel insulator layer 160 is also preferably applied over the peripheral edges of the lower electrode as previously described.

Figure 5B:
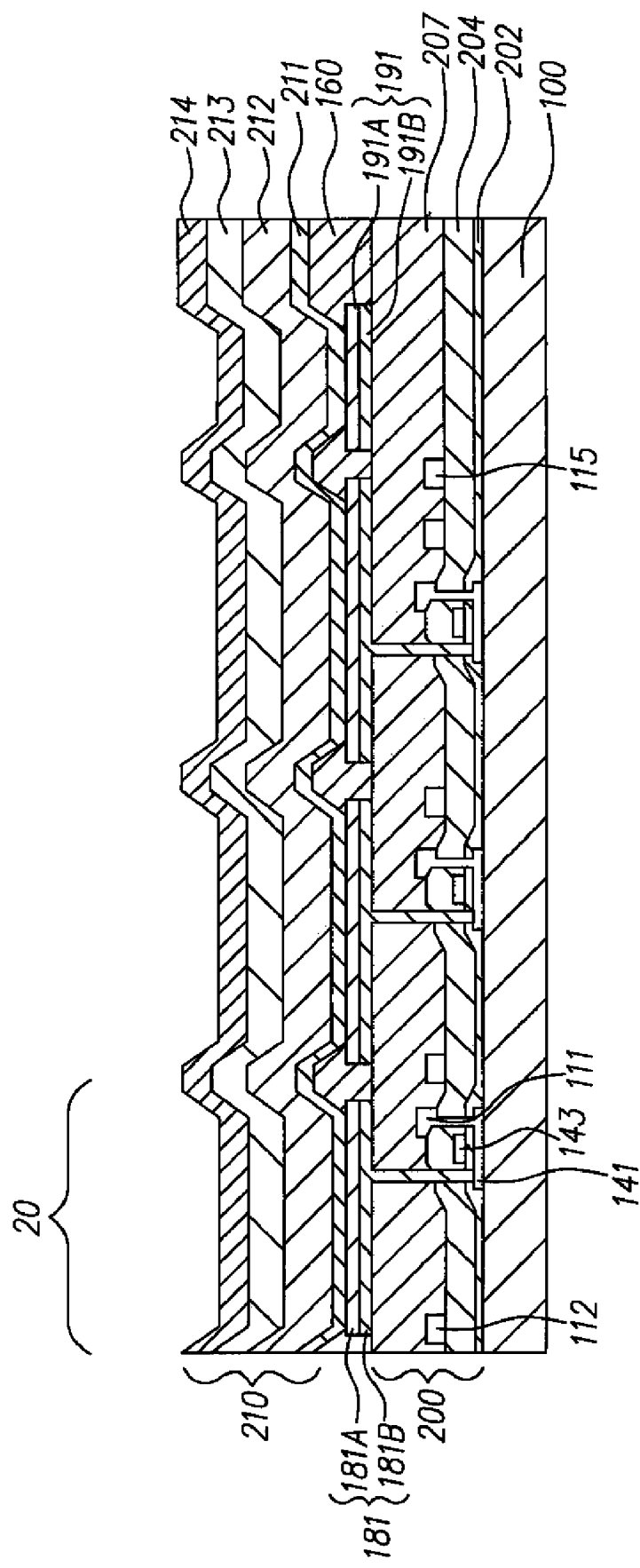

Next, as shown in FIG. 5b, organic EL media 210 are deposited over the pixels, such as pixel 20 and its neighboring pixels. One of more of the organic EL media 210 layers is continuous between the different pixels and is not precisely patterned. The organic EL media 210 layers are also deposited over the radiation absorbing structure 191. This configuration prevents the need to precisely align shadow masks to control the deposition on a pixel level, which would otherwise increases the production cost. Non-precision shadow masks may still be employed, however, to prevent deposition of the Organic EL media materials on the connector region. Such non-precision shadow masks do not require precision alignments and usually have a longer useful life. Therefore use of non-precision shadow masks results in a lower manufacturing cost than use of precision shadow masks.

Figure 5C:
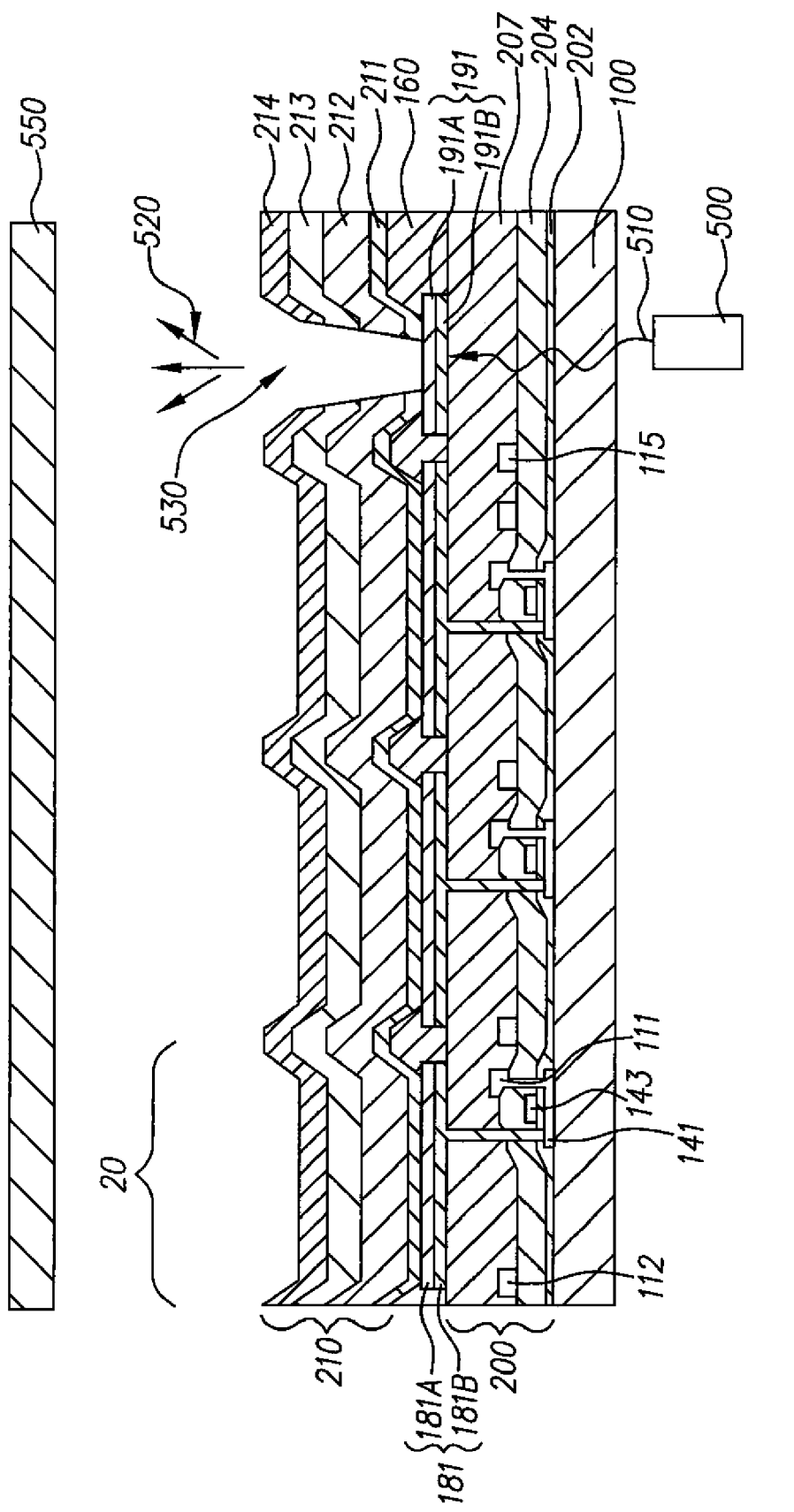

Subsequently, as shown in FIG. 5c, the radiation absorption structure 190 is exposed to radiation 510. This radiation is absorbed by radiation absorption structure 190, resulting in the localized ablation of a portion of organic EL media 210 thereby forming opening 530. The ablated portion of organic EL media 210 may result in objected particles or vapor, such as ejecta 520, or may melt and reflow away from the opening 530. Optionally, a collection arrangement 550 may be employed to collect the ejecta and prevent redeposition of the material onto the surface of the device. Collection arrangement 550 can be a vacuum suction port, an adhesive service, or a cold trap surface, such as a surface cooled for, by example, liquid nitrogen. Radiation 510 is produced by radiation source 500, which is preferably a laser, such as a diode laser having peak wavelength between 800 and 850 nm or a Nd:YAG type laser. In this arrangement, the radiation source 500 is positioned such the radiation passes through the substrate 100 to expose the absorbent lower portion 191*b* of radiation absorbing structure 191. In this arrangement the substrate 100 is preferably transparent, and is for example glass. However, the present invention is not limited to this arrangement and in alternate embodiments, the radiation source may be position above the substrate 100.

As shown in FIG. 5*c*, radiation 510 is selectively exposed to the radiation absorbing structure 191. That is, radiation absorbing structure 191 is exposed to radiation 510 while other parts of the device are not. This limits heating to the area where the opening 530 is to be made and reduces the heat to other areas of the device thereby reducing the chance of damaging the organic EL media in areas of the device intended to emit light. The selectivity is achieved by using a laser or array of lasers capable of forming spots of approximately less than the area of the radiation absorbing structures. The radiation source 500 is then aligned to the substrate prior to exposure.

Figure 5D:
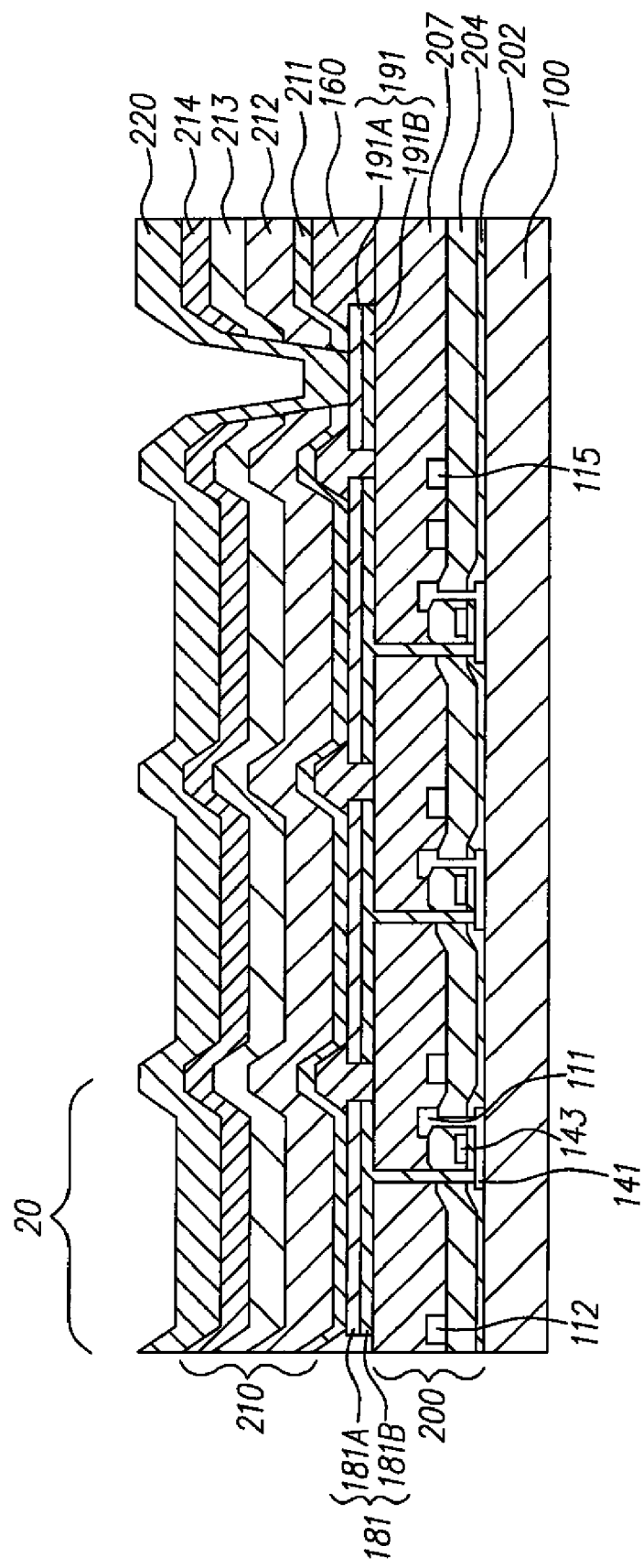

Next, as illustrated in FIG. 5*d*, the circuit is completed by forming upper electrode 220. Upper electrode 220, in formed over organic EL media 210 and in the area where the opening was formed, upper electrode 220 makes electrical connection to the radiation absorption structure 191. According to this embodiment, radiation absorption structure 191 is in electrical contact (not shown) with conductive bus line 115 as previously described, therefore, upper electrode 220 is electrically connected to conductive bus line 115. Further steps of providing color filter elements or encapsulation structure can also be performed as previously described.

Figure 6:
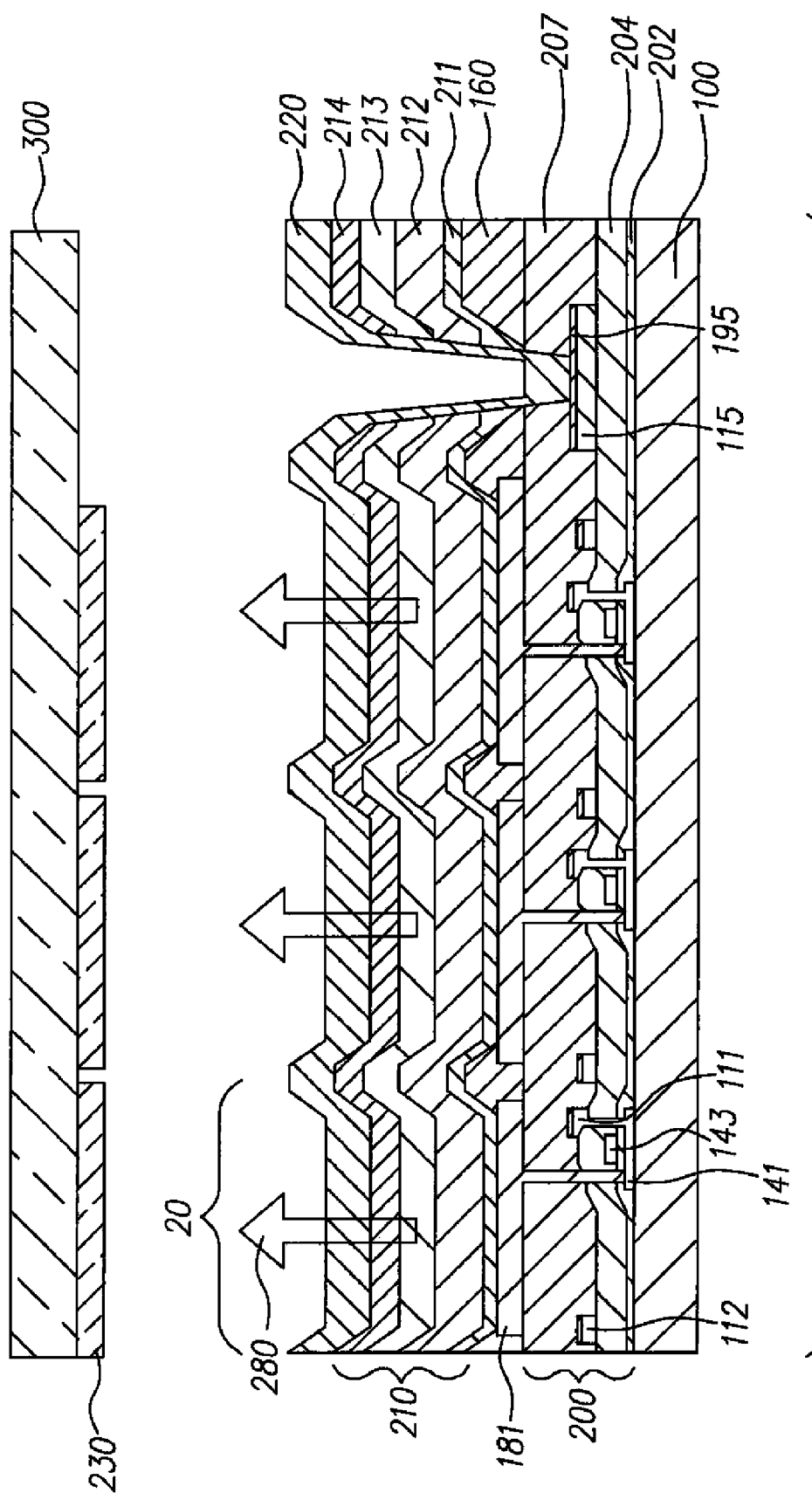
FIG. 6 depicts a cross sectional view along line of an OLED display device according to the second embodiment of the present invention.

FIG. 6 illustrates a cross-sectional view of an OLED display device according to the second embodiment of the present invention. In the second embodiment, radiation absorbing structure 195 is formed above conductive bus line 115. Radiation absorbing structure 195 can be formed over the entire conductive bus line 115 or over just a portion of the conductive bus line 115. The radiation absorbing structure 195 can have the same surface pattern area as the conductive bus line 115 (as shown), extend beyond the edges of the conductive bus line 115 or have a smaller surface pattern area than the conductive bus line 115. However, it is preferred that the radiation absorbing structure 195 be formed in the same patterning step (i.e. photolithographic patterning and etch) as the conductive bus line 115 so avoid the need for addition patterning steps which would result in higher manufacturing cost. That is, radiation absorbing structure 195 and conductive bus line 115 are formed in the same layer and are patterned at the same time. As such, the absorbing material can also be present above the other features that are formed from the second conductive layer, such as power line 111 and data line 112.

The radiation absorbing structure 195 can be formed of a layer of material that is at least partially absorbing to the radiation used to form the opening in the organic EL media layers. It is also preferable that the radiation absorbing structure 195 is conductive to allow for electrical connection between the upper electrode 220 and the conductive bus line 115. Useful radiation sources include diode lasers having a peak wavelength between 800 and 850 nm or Nd:YAG type lasers. In this case, useful materials for radiation absorption structure 195 include Cr and Mo formed at a thickness of between 25 and 100 nm. In the arrangement shown, the radiation source is directed down to expose the radiation absorbing structure 195 from the side opposite the substrate 100. However, alternate arrangements where the radiation source is below the substrate 100 and the radiation passes through the substrate 100 can also be practiced if the radiation absorbing structure 195 is instead disposed between the conductive bus line 115 and the substrate 100.

Above radiation absorbing structure 195, an opening is formed in the insulating layer 207 to allow for the organic EL media 210 to be deposited on the radiation absorbing structure 195 and for the upper electrode 220 to be electrically connected to conductive bus line 115. This opening is formed by conventional lithography and etch methods and can be formed at the same time as other vias such as the via connecting first electrode 181 to second semiconductor region 141.

The invention has been described in detail with particular reference to certain preferred embodiments thereof, but it will be understood that variations and modifications can be effected within the spirit and scope of the invention.

PARTS LIST 10 light-emitting diode
20 pixel
30 pixel region
40 connector region
41 connector pad
42 connector pad
50 select line driver
60 data line driver
100 substrate
111 power line
112 data line
113 select line
114 capacitor line
115 Conductive bus line
120 select transistor
121 first semiconductor region
122 via
130 storage capacitor
140 power transistor
141 second semiconductor region
142 via
143 power transistor gate
145 via
146 via
160 interpixel insulator layer
181 lower electrode
181*a* upper portion
181*b* lower portion Parts List cont'd
191 radiation absorbing structure
191*a* upper portion
191*b* lower portion
192 via
195 radiation absorbing structure
200 active matrix circuitry layers
202 insulating layer
204 insulating layer
207 insulating layer
210 organic EL media
211 hole injecting layer
212 hole transporting layer
213 light-emitting layer
214 electron transporting layer
220 upper electrode
230 color filter element
280 light emission
300 transparent cover
500 radiation source
510 radiation 520 ejecta
530 opening
550 collection arrangement

The invention claimed is:

1. A method of making an OLED device, comprising in sequence:
   a) providing a substrate having a first electrode and a conductive bus line provided over the substrate, the conductive bus line being in contact with a radiation absorbing structure;
   b) providing organic EL media over the first electrode, the radiation absorbing structure and the conductive bus line;
   c) exposing the radiation absorbing structure to radiation to produce heat sufficient to ablate a portion of the organic EL media thereby forming an opening in the organic EL media without removal of the conductive bus line; and
   d) forming a second electrode over the organic EL media, and through the opening in the organic EL media to form an electrical connection between the second electrode and the conductive bus line.

2. The method of claim 1 wherein the radiation absorbing structure is conducting and in electrical contact with the conductive bus line.

3. The method of claim 1 wherein the radiation passes through the substrate before being absorbed by the radiation absorbing structure.

4. The method of claim 1 wherein the radiation absorbing structure includes Mo or Cr.

5. The method of claim 1 wherein the radiation is produced by a laser.

6. The method of claim 1 wherein the radiation is light having a peak wavelength of between 700 and 1100 nm.

7. The method of claim 1 wherein the radiation selectively exposes the radiation absorbing structure.

8. The method of claim 1 wherein the radiation absorbing structure and the first electrode are patterned at the same time from the same material(s).

9. The method of claim 8 wherein the radiation absorbing structure and first electrode each have a lower portion which is absorbing to the radiation and an upper portion which is reflective of visible light and the radiation is selectively exposed on the radiation absorbing structure and not on the first electrode.

10. The method of claim 1 wherein the radiation absorbing structure and the conductive bus line have the same pattern.

11. A method of making an OLED device, comprising in sequence:
    a) providing a substrate having a first electrode and a conductive bus line formed of a first material provided over the substrate, the conductive bus line being in contact with a radiation absorbing structure formed of a second material that is different from the first material;
    b) providing organic EL media over the first electrode, the radiation absorbing structure and the conductive bus line;
    c) exposing the radiation absorbing structure to laser radiation to produce heat sufficient to ablate a portion of the organic EL media thereby forming an opening in the organic EL media without removal of the conductive bus line; and
    d) forming a second electrode over the organic EL media, and through the opening to electrically connect the second electrode to the conductive bus line.

12. The method of claim 11 wherein the laser radiation passes through the substrate before being absorbed by the radiation absorbing structure.

13. The method of claim 11 wherein the laser radiation is light having a peak wavelength of between 700 and 1100 nm.

* * * * *